United States Patent
Jin et al.

(10) Patent No.: US 9,559,319 B2
(45) Date of Patent: *Jan. 31, 2017

(54) CARBON NANOTUBE COMPOSITE LAYER (71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/693,848

(22) Filed: Apr. 22, 2015

(65) Prior Publication Data
US 2015/0311460 A1  Oct. 29, 2015

(30) Foreign Application Priority Data

Apr. 24, 2014  (CN) .......................... 2014 1 0167805

(51) Int. Cl.
*H01L 51/05* (2006.01)
*H01L 51/00* (2006.01)

(52) U.S. Cl.
CPC ....... *H01L 51/0566* (2013.01); *H01L 51/0048* (2013.01); *H01L 51/0545* (2013.01); *H01L 2251/301* (2013.01); *H01L 2251/303* (2013.01)

(58) Field of Classification Search
CPC ............. H01L 51/0566; H01L 51/0048; H01L 2251/301; H01L 2251/303
See application file for complete search history.

(56) References Cited

U.S. PATENT DOCUMENTS 8,282,861 B2  10/2012  Hsu et al.
8,354,772 B1 *  1/2013  Chen .................. B29B 7/00
                                                    310/311

(Continued)

FOREIGN PATENT DOCUMENTS

JP  P2009-298691 A  12/2009
JP  P2012-246209 A  12/2012

(Continued)

OTHER PUBLICATIONS

Koroteev et al., Charge Transfer in the MoS2/Carbon Nanotube Composite, The Journal of Physical Chemistry, 115, 2011, pp. 21199-21204.*

(Continued)

*Primary Examiner* — Earl Taylor
(74) *Attorney, Agent, or Firm* — Zhigang Ma (57) ABSTRACT

A carbon nanotube composite layer includes a number of semiconductor particles and a number of carbon nanotubes. The number of semiconductor particles are dispersed into the number of carbon nanotubes, the number of carbon nanotubes and the number of semiconductor particles are electrically connected with each other, each of the number of semiconductor particles includes a semiconductor fragment, the semiconductor fragment includes a number of semiconductor molecular layers stacked together, a number of the number of semiconductor molecular layers ranges from about 1 to about 20, an area of the semiconductor fragment ranges from about 0.1 square micrometers to about 5 square micrometers, and a thickness of the semiconductor fragment range from about 2 nanometers to about 20 nanometers.

19 Claims, 8 Drawing Sheets

(56) References Cited

U.S. PATENT DOCUMENTS

| | | | | |
|---|---|---|---|---|
| 8,900,390 | B2* | 12/2014 | Jiang | C01B 31/0469 |
| | | | | 156/155 |
| 8,963,141 | B2 | 2/2015 | Murata | |
| 9,048,055 | B2 | 6/2015 | Cai et al. | |
| 2005/0001528 | A1* | 1/2005 | Mao | C23C 18/1204 |
| | | | | 313/309 |
| 2008/0035370 | A1* | 2/2008 | Kosowsky | B82Y 10/00 |
| | | | | 174/257 |
| 2009/0220771 | A1* | 9/2009 | Fleming | H01B 1/18 |
| | | | | 428/328 |
| 2009/0283752 | A1* | 11/2009 | Jiang | B82Y 10/00 |
| | | | | 257/24 |
| 2010/0139956 | A1* | 6/2010 | Kosowsky | B82Y 10/00 |
| | | | | 174/257 |
| 2010/0252802 | A1* | 10/2010 | Numata | B82Y 10/00 |
| | | | | 257/9 |
| 2010/0285656 | A1* | 11/2010 | Esconjauregui | B01J 23/74 |
| | | | | 438/478 |
| 2011/0203632 | A1* | 8/2011 | Sen | B82Y 10/00 |
| | | | | 136/244 |
| 2011/0262772 | A1* | 10/2011 | Hauge | B29C 43/22 |
| | | | | 428/688 |
| 2011/0268884 | A1* | 11/2011 | Wind | B82Y 10/00 |
| | | | | 427/272 |
| 2012/0212904 | A1* | 8/2012 | Fleming | H01B 1/18 |
| | | | | 361/679.56 |
| 2012/0256166 | A1 | 10/2012 | Chen et al. | |
| 2012/0315539 | A1* | 12/2012 | Lashmore | H01B 1/04 |
| | | | | 429/211 |
| 2013/0133718 | A1* | 5/2013 | Sen | B82Y 10/00 |
| | | | | 136/244 |
| 2013/0189565 | A1* | 7/2013 | Lashmore | H01M 4/366 |
| | | | | 429/163 |
| 2014/0054511 | A1 | 2/2014 | Chou et al. | |
| 2014/0080040 | A1* | 3/2014 | Fontecchio | G02F 1/13342 |
| | | | | 430/2 |
| 2015/0311458 | A1* | 10/2015 | Jin | H01L 51/0048 |
| | | | | 257/347 |
| 2015/0311459 | A1* | 10/2015 | Jin | H01L 51/0558 |
| | | | | 438/478 |
| 2015/0311460 | A1* | 10/2015 | Jin | H01L 51/0566 |
| | | | | 257/12 |

FOREIGN PATENT DOCUMENTS

| | | |
|---|---|---|
| TW | 201127895 | 8/2011 |
| TW | 201139266 | 11/2011 |
| TW | 201222824 | 6/2012 |
| TW | 201242892 | 11/2012 |
| TW | 201408356 | 3/2014 |

OTHER PUBLICATIONS

O'Neill et al., Preparation of High Concentration Dispersions of Exfoliated MoS2 with Increased Flake Size, Chemistry of Materials, 24, 2012, pp. 2414-2421.*

Das et al., High Performance Multilayer MoS2 Transistors with Scandium Contacts, Nano Letters, 13, 2013, pp. 100-105.*

Eda et al., Photoluminescence from Chemically Exfoliated MoS2, Nano Letters, 11, 2011, pp. 5111-5116.*

Wang et al., Facilitated Lithium Storage in MoS2 Overlayers Supported on Coaxial Carbon Nanotubes, Journal of Physical Chemistry C, vol. 111, No. 4, 2007, pp. 1675-1682.*

Jariwala et al., Gate-tunable carbon nanotube—MoS2 heterojunction p-n. diode, PNAS, vol. 110, No. 45, 2013, pp. 18076-18080.*

Radisavljevic et al., Single-layer MoS2 transistors, Nature Nanotechnology, vol. 6, 2011, pp. 147-150.*

Coleman et al., Two-Dimensional Nanosheets Produced by Liquid Exfoliation of Layered Materials, Science, vol. 331, 2011, pp. 568-571.*

* cited by examiner

CARBON NANOTUBE COMPOSITE LAYER

This application claims all benefits accruing under 35 U.S.C. §119 from China Patent Application No. 201410167805.5, filed on Apr. 24, 2014 in the China Intellectual Property Office.

BACKGROUND

1. Technical Field

The present invention relates to a carbon nanotube composite layer.

2. Description of Related Art

A typical thin film transistor (TFT) is made of a substrate, a gate electrode, an insulation layer, a drain electrode, a source electrode, and a semiconducting layer.

The thin film transistor performs a switching operation by modulating an amount of carriers accumulated in an interface between the insulation layer and the semiconductor layer from an accumulated state to a depletion state, with applied voltage to the gate electrode, to change an amount of the current passing between the drain electrode and the source electrode. However, at present, the semiconductor material such as metal sulfides or transition metal oxide in the semiconductor layer comprises more than hundreds of layers, thus the thickness is high, and the semiconductor material is hard to form a conductive network between the drain electrode and the source electrode. Thus the semiconductor layer cannot be suitable for large-scaled thin film transistor.

What is needed, therefore, is a semiconductor layer that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
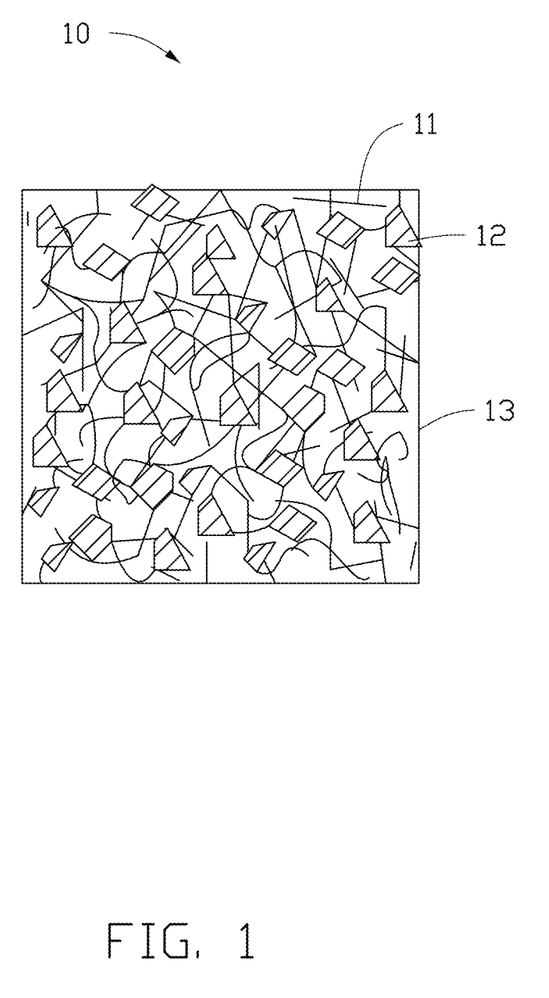
FIG. 1 is a schematic view of one embodiment of a carbon nanotube composite film.

Referring to FIG. 1, a carbon nanotube composite layer 10 of one embodiment comprises a plurality of carbon nanotubes 11 and a plurality of semiconductor particles 12. The plurality of semiconductor particles 12 are uniformly dispersed on the plurality of carbon nanotubes 11. The carbon nanotube composite layer 10 can be supported by a substrate 13.

Figure 2:
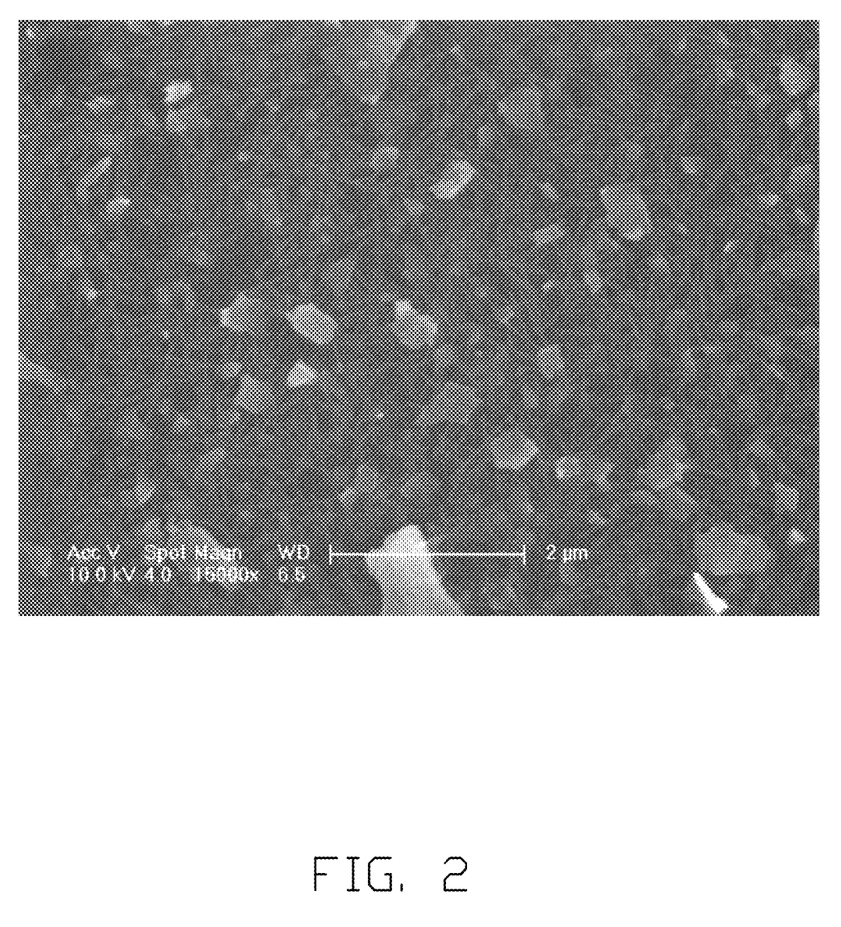
FIG. 2 shows a Scanning Electron Microscope (SEM) image of the carbon nanotube composite film.

Referring also to FIG. 2, the plurality of carbon nanotubes 11 are randomly distributed on the substrate 13. The plurality of semiconductor particles 12 are in directly contact with the plurality of carbon nanotubes 11. In one embodiment, the plurality of semiconductor particles 12 can be attached on an outer surface of single carbon nanotube 11. The plurality of semiconductor particles 12 can also be sandwiched between adjacent two carbon nanotubes 11. Furthermore, the adjacent two carbon nanotubes 11 can be electrically connected by the semiconductor particles 12. Thus the plurality of carbon nanotubes 11 and the plurality of semiconductor particles 12 are electrically connected with each other to form a conductive network.

The plurality of carbon nanotubes 11 can be spaced from each other, entangled with each other, or connected with each other. While the adjacent two carbon nanotubes 11 are spaced from each other, the semiconductor particles 12 can be dispersed between the adjacent two carbon nanotubes 11 and in contact with the carbon nanotubes 11. Thus the adjacent two carbon nanotubes 11 are electrically connected with each other via the semiconductor particles 12. While a voltage is supplied on the two opposite ends of the carbon nanotube composite layer 10, the plurality of semiconductor particles 12 and the plurality of carbon nanotubes 11 are electrically connected with each other to form the conductive network.

The plurality of semiconductor particles 12 and the plurality of carbon nanotubes 11 are at least partly overlapped to form at least one conductive path. In one embodiment, the plurality of semiconductor particles 12 and the plurality of carbon nanotubes 11 form a plurality of conductive paths. Referring to FIG. 1, in one embodiment, the plurality of conductive paths extend along a plurality of curves or a plurality of straight lines.

A distribution density of the plurality of carbon nanotubes 11 can range from about 5/squar micrometers to about 15/squar micrometers, to ensure that there are enough carbon nanotubes 11 can form the conductive network. An area ratio of the plurality of semiconductor particles 12 in the carbon nanotube composite layer 10 ranges from about 30% to about 50%, which means that the plurality of semiconductor particles 12 cover at least 30% of the surface of the carbon nanotube composite layer 10. In one embodiment, a distribution density of the semiconductor particles 12 ranges from about 5/square micrometers to about 10/square micrometers, thus the spaced adjacent two carbon nanotubes 11 can be electrically connected to each other via the semiconductor particles 12. Furthermore, there are also a majority of carbon nanotubes 11 in the conductive network, and carbon nanotubes 11 are still the main participation of carbon nanotube composite layer 10. In one embodiment, the distribution density of the carbon nanotubes 11 ranges from about 5/square micrometers to 10/square micrometers. The ratio of the semiconductor particles 12 in the carbon nanotube composite layer 10 ranges from 30% to about 40% in area. The distribution density of the semiconductor particles 12 ranges from about 5/square micrometers to about 7/squre micrometers.

A material of the semiconductor particle 12 can be transition metal sulfides, transition metal oxides, or non-metal nitrides. The material of the semiconductor particles 12 can be $MoS_2$, $WS_2$, $WSe_2$, $WTe_2$, BN, $MnO_2$, ZnO, $MoSe_2$, $MoTe_2$, $TaSe_2$, $NiTe_2$, $Bi_2Te_3$. The P-type semiconductor material comprises $WS_2$, $WSe_2$, and $WTe_2$. The N-type semiconductor material comprises $MoS_2$, BN, $MnO_2$, ZnO, or $MoTe_2$. Different type semiconductor material distributed in the carbon nanotubes 11 can determine the type of the carbon nanotube composite layer 10.

A shape of each of the plurality of semiconductor particles 12 can be rectangular, triangular, polygonal, or irregular shape. Each of the plurality of semiconductor particles 12 is a sheet film and has an area ranges from about 3 square micrometers to about 4 square micrometers. A thickness of each of the plurality of semiconductor particles 12 ranges from about 2 nanometers to about 20 nanometers. In one embodiment, the thickness ranges from about 2 nanometers to about 10 nanometers.

The plurality of semiconductor particles 12 are derived and stripped from the layered semiconductor material with hundreds of layers. The plurality of semiconductor particles 12 have quite small thickness and huge size relatively. A ratio between the area and the thickness of each of the plurality of semiconductor particles 12 ranges from about $3\times10^5$ nanometer to about $4\times10^5$ nanometer. Each of the plurality of semiconductor particles 12 is a layered structure with a plurality of semiconductor molecular layers. Each of the plurality of semiconductor molecular layers has a thickness of single molecule. Each of the plurality of semiconductor particles 12 has several semiconductor molecular layers smaller than 100 layers. In one embodiment, each of the plurality of semiconductor particles 12 has a number of layers ranging from about 1 layer to about 20 layers. Because of each of the plurality of semiconductor particles 12 have few layers smaller than 100, the carbon nanotube composite layer 10 can be effectively modulated by the gate electrode in TFT, and the sensitivity of the thin film transistor can be improved.

Figure 3:
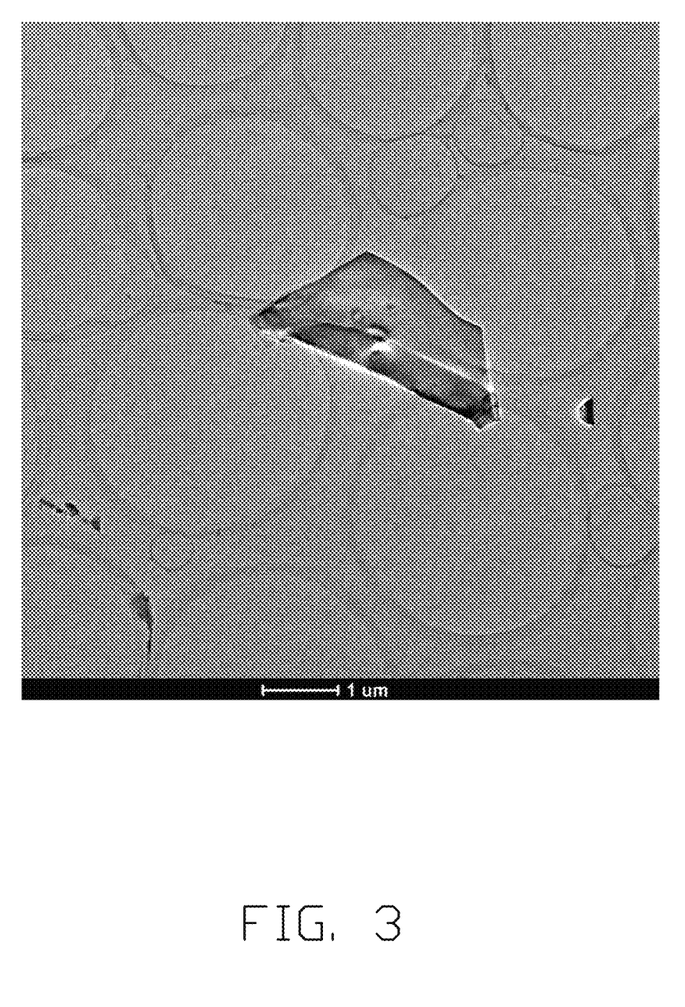
FIG. 3 shows a Transmission Electron Microscope (TEM) image of semiconductor particles.

Referring to FIG. 3, in one embodiment, the material of the semiconductor particles 12 is $MoS_2$, the shape of each semiconductor particle 12 is rectangular, the area of each semiconductor particle 12 ranges from about 0.1 square micrometers to about 3 micrometers. A number of layers of each semiconductor particles 12 range from about 10 layers. The thickness of semiconductor particles 12 is about 7 nanometers.

The carbon nanotubes 11 can be semiconductor carbon nanotubes. The carbon nanotubes 11 can also comprise metallic carbon nanotubes. A percentage of the semiconductor carbon nanotubes in the carbon nanotubes 11 are about 66.7%, 90%, 95%, or 98%, thus the carbon nanotube composite layer 10 is semiconducting as a whole. In one embodiment, the carbon nanotubes 11 can be obtained by CVD method. A ratio between the semiconductor carbon nanotubes and the metallic carbon nanotubes is about 2:1. The percentage of the semiconductor carbon nanotubes is about 66.7%. Furthermore, the metallic carbon nanotubes can be removed, and the semiconductor carbon nanotubes can be left. In one embodiment, the percentage of the semiconductor carbon nanotubes is greater than 66.7%. The carbon nanotube can be single walled. A diameter of each carbon nanotube 11 is smaller than 5 nanometers. In one embodiment, the diameter of each carbon nanotube 11 is smaller than 2 nanometers.

The plurality of carbon nanotubes 11 are parallel with the surface of the substrate 13. A length of each carbon nanotube 11 is greater than 5 micrometers. In one embodiment, the length of each carbon nanotube 11 is greater than 10 micrometers. The carbon nanotubes of the carbon nanotube layer can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

The plurality of carbon nanotubes 11 can be electrically connected by the semiconductor particles 12. The carbon nanotube composite layer 10 is a conductive network, and a plurality of apertures are distributed in the carbon nanotube composite layer 10. A diameter of each aperture is about 50 micrometers. Because the carbon nanotube composite layer 10 defines the plurality of apertures, thus the carbon nanotube composite layer 10 has greater transparency. The thickness of the carbon nanotube composite layer 10 ranges from about 2 nanometers to about 20 nanometers. In one embodiment, the thickness is about 15 nanometers.

While the carbon nanotubes 11 are pure semiconductor carbon nanotubes, the adjacent two carbon nanotubes 11 are electrically connected via the semiconductor particles 12. The semiconductor particles 12 can transfer carries between the adjacent two carbon nanotubes 11. While the carbon nanotubes 11 comprise metallic carbon nanotubes, the semiconductor particles 12 can reduce the metallic characteristic. Thus the carbon nanotube composite layer 10 is semiconducting. Furthermore, the semiconductivity of the carbon nanotube composite layer 10 can be adjusted by the percentage of the semiconductor particles 12.

Figure 4:
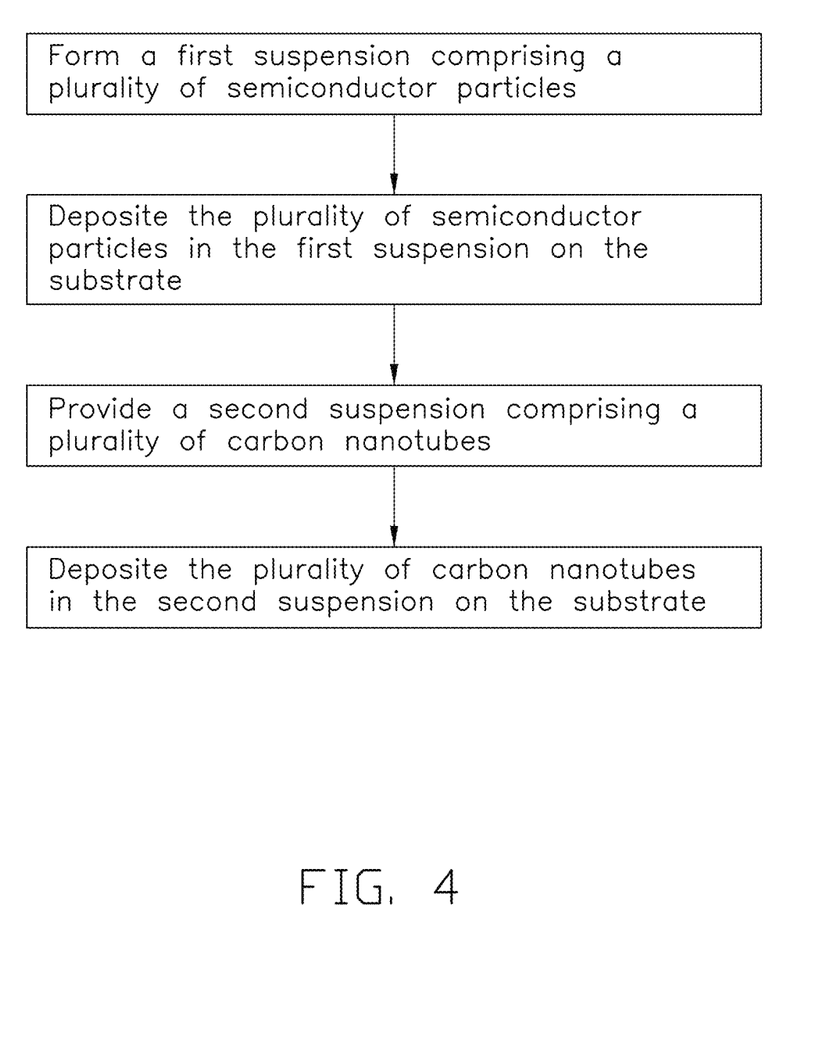
FIG. 4 shows a schematic view of one embodiment of a method of making carbon nanotube composite film.

Referring to FIG. 4, one embodiment of a method of making carbon nanotube composite layer 10 comprises:

(S11), forming a first suspension comprising a plurality of semiconductor particles 12;

(S12), depositing the plurality of semiconductor particles 12 in the first suspension on the substrate 13;

(S13), providing a second suspension comprising a plurality of carbon nanotubes 11; and (S14), depositing the plurality of carbon nanotubes 11 in the second suspension on the substrate 13.

In step (S11), the first suspension is formed by:

(S111), providing a semiconductor material;

(S12), forming a semiconductor particles suspension by mixing and sonicating the semiconductor material with a first solvent, wherein each of the semiconductor particles suspension comprises a plurality of semiconductor particles, each of the plurality of semiconductor particles comprises a plurality of semiconductor molecular layers, and the quantity of the plurality of semiconductor layers range from about 1 to 20.

In step (S111), the semiconductor material is a layered structure comprising over hundreds of molecular layers. The semiconductor material can be a transition metal compound, or combinations thereof, such as $MoS_2$, WS2, BN, $MnO_2$, ZnO, $MoSe_2$, $MoTe_2$, $TaSe_2$, $NiTe_2$, or $Bi_2Te$. In one embodiment, the semiconductor material is $MoS_2$.

In step (S112), the semiconductor material is ultrasonicated in the first solvent to obtain the plurality of semiconductor particles with several semiconductor molecular layers. Under the action of ultrasonic waves, the micro-bubbles maintain vibration in the first solvent. While the sound intensity reaches a certain level, the micro-bubbles rapidly expand, and then quickly closed. In this process, shock wave is instantaneously generated, and can apply great pressure around the micro-bubbles. The adjacent molecular layers in the semiconductor material are separated under the repeated action of the shock wave. Thus the semiconductor particles with a few number of molecular layers is obtained.

The first solvent means a polar solvent containing a hydroxyl group or a carbonyl group, or other polar groups. The first solvent has strong polarity, large dielectric constant, such as water, ethanol, N-methylpyrrolidone (NMP), acetone, chloroform, or tetrahydrofuran. In one embodiment, the first solvent has low-boiling point. In the first solvent, the attractive force between adjacent semiconductor molecular layers will be decreased under the action of the polar group. Thus the semiconductor molecular layer can be easier to be separated.

A mixed ratio between the semiconductor material and the first solvent can be 1 g/100 mL, 1 g/50 mL, 1 g/30 mL, 1 g/20 mL, or 1 g/10 mL, and can be selected according to need.

The ultrasonic power can range from about 300 watts to about 600 watts. The ultrasonic time can range from about 5 hours to about 24 hours. In one embodiment, the mixing ratio of the semiconductor material and the first solvent is 1 g/30 mL, the first solvent is NMP, the ultrasonic power is about 300 watts, and the ultrasonic time is about 8 hours.

In detail, each of the plurality of semiconductor particles 12 comprises a semiconductor fragment. An area of the semiconductor fragment ranges from about 0.1 square micrometers to about 5 square micrometers. A thickness of the semiconductor fragment ranges from about 2 nanometers to about 20 nanometers.

Furthermore, the semiconductor particles suspension can be treated via centrifugation filtration to remove the semiconductor particles with a large number of molecular layers. The semiconductor particles with few molecular layers will be suspended in the middle and upper suspension.

In step (S12), the substrate 13 supports the carbon nanotube composite layer 10. The material of the substrate 13 can be rigid materials (e.g., p-type or n-type silicon, silicon with an silicon dioxide layer formed thereon, crystal, crystal with a oxide layer formed thereon), or flexible materials (e.g., plastic or resin). In one embodiment, the material of the insulating substrate is glass. The shape and size of the substrate 13 is arbitrary. Furthermore, the substrate 13 can be pre-treated, and a plurality of polar groups can be formed on the substrate 13. Thus the substrate 13 can have a polar surface, and the carbon nanotube composite layer 10 can be tightly attached on the polar surface. The polar groups can be amino, hydroxyl, or carboxyl.

The substrate 13 can be pretreated by following steps. First, the substrate 13 is treated with hydrophilic treatment; second, the substrate 13 is treated with an organic solvent. The substrate 13 can be treated with a mixture of hydrogen peroxide and ammonia, thus the surface of the substrate 13 can comprise hydroxyl groups. The organic solvent can be ammonia propyl triethoxy silane (APTES). Both the hydroxyl groups and the carbon nanotubes can be tightly combined with the APTES. Thus the carbon nanotubes 11 can de quickly and firmly attached on the substrate 13.

The plurality of semiconductor particles 12 can be deposited on the substrate 13 via physical deposition. The substrate 13 can be located at bottom of a container; the first suspension can be introduced into the container; after depositing for a determined time, the semiconductor particles 12 can be slowly deposited on the substrate 13 under gravity force. The predetermined time can range from about 5 hours to about 24 hours. In one embodiment, the predetermined time is about 10 times.

Furthermore, the substrate 13 with the semiconductor particles 12 is taken out of the container and dried. Thus the plurality of semiconductor particles 12 can be tightly attached on the substrate via van der Waals force.

In step (S13), the second suspension can be formed by dispersing the plurality of carbon nanotubes 11 in a second solvent via mixing method or ultrasonic method.

The plurality of carbon nanotubes 11 can be uniformly dispersed in the second solvent, and sonicated for a determined period. The determined period ranges from about 30 minutes to about 3 hours. The ultra sonic power can range from about 300 W to about 600 W.

The second solvent can not be reacted with the plurality of carbon nanotubes 11, and the plurality of carbon nanotubes can be suspended in the second solvent. The second solvent can be water, ethanol, N-methyl pyrrolidone (NMP), acetone, chloroform, or tetrahydrofuran. The second solvent has strong polarity and large dielectric constant. The second solvent can be same as or different from the first solvent. The mixing ratio between the carbon nanotubes 11 and the second solvent ranges from about 1 mg/200 mL to about 1 mg/40 mL, such as 1 mg/100 mL, 1 mg/50 mL. A weight ratio between the carbon nanotubes 11 and the semiconductor particles 12 ranges from about 1:1000 to about 1:3000. Thus the plurality of carbon nanotubes 11 can be electrically connected by the semiconductor particles 12, and the carbon nanotube composite layer 10 is mainly conducted through the carbon nanotubes 10.

In step (S14), the plurality of can be deposited on the substrate 13 via following steps. The substrate 13 with the semiconductor particles 12 is located on a bottom of a container. The second suspension is injected into the container. After a determined time, the carbon nanotubes 11 will be deposited on the substrate 13 via the polarity group and the gravity force. Referring to FIG. 2, the plurality of semiconductor particles 12 are dispersed in the first suspension, and the carbon nanotubes 11 are dispersed in the second suspension. Thus the plurality of semiconductor particles 12 can be distributed in the carbon nanotube composite layer 10. Both the semiconductor particles 12 and the carbon nanotubes 11 can conduct electrical current. The deposition time of the second suspension can range from about 20 minutes to about 2 hours. In one embodiment, the deposition time is 30 minutes.

Furthermore, the carbon nanotube composite layer 10 can be dried after step (S14). After the carbon nanotube composite layer 10 and the substrate 13 are taken out of the container, the solvent between the carbon nanotube composite layer 10 and the substrate 13 will be evaporated. Thus the carbon nanotube composite layer 10 can be tightly attached on the substrate 13.

The method of making carbon nanotube composite layer 12 has following advantages. The semiconductor particles 12 are firstly deposited on the substrate 13, and the carbon nanotubes 11 is deposited on the semiconductor particles 12, thus the semiconductor particles 12 can be distributed into the carbon nanotubes 11, and the aggregation of the carbon nanotubes 11 and semiconductor particles 12 can be avoided. The carbon nanotube composite layer 10 has uniformly thickness, thus the defects in the carbon nanotube composite layer 10 can be avoided. The semiconductor particles 12 cannot deposited into the carbon nanotubes 11 can be avoided while firstly depositing the carbon nanotubes. By adjusting the weight ratio between the carbon nanotubes 11 and the semiconductor particles 12, thus the conductivity of the carbon nanotube composite layer 10 can be conveniently adjusted. The P-type or N-type carbon nanotube composite layer 10 can also be obtained by selecting different type semiconductor particles 12.

Figure 5:
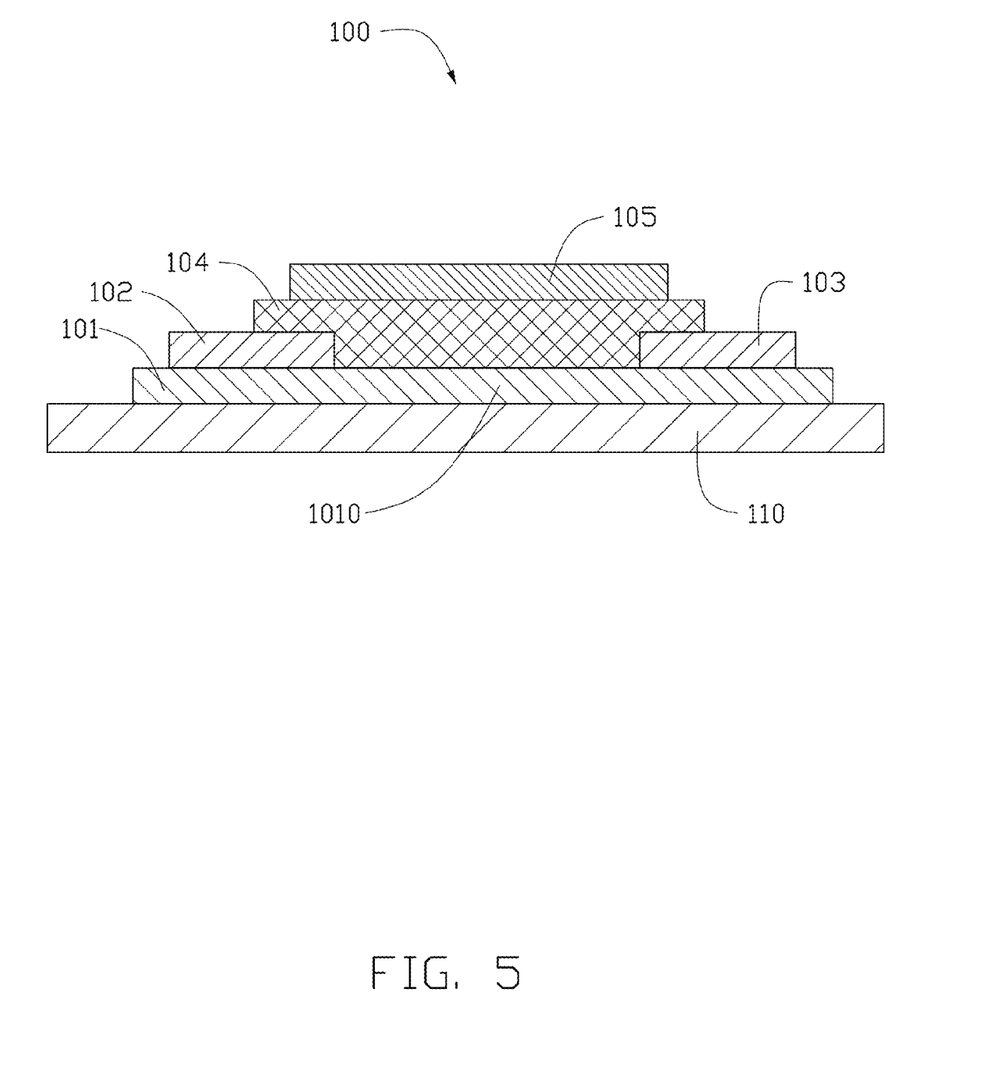
FIG. 5 shows a schematic view of one embodiment of a TFT.

Referring to FIG. 5, a thin film transistor 100 of one embodiment comprises a semiconductor layer 101, a source electrode 102, a drain electrode 103, an insulating layer 104, and a gate electrode 105. The semiconductor layer 101, the source electrode 102, the drain electrode 103 can be located on a surface of the insulating layer 104. The source electrode 102 and the drain electrode 103 are spaced from each other and electrically connected to the semiconductor layer 101. The gate electrode 105 is insulated from the semiconductor layer 101, the source electrode 102, and the drain electrode 103 because of the insulating layer 104. The thin film transistor 100 is located on a surface of an insulating substrate 110.

The gate electrode 105 is located on the insulating substrate 110, and the insulating layer 104 covers the gate electrode 105. The semiconductor layer 101 is located on the insulating layer 104, and insulated from the gate electrode 105 through the insulating layer 104. The source electrode 102 and the drain electrode 103 are spaced apart from each other and electrically connected to the semiconductor layer 101. A channel 1010 is formed in the semiconductor layer 101 at a region between the source electrode 102 and drain electrode 103. The channel 1010 is a portion of the semiconductor layer 101.

The semiconductor layer 101 comprises a carbon nanotube composite layer 10. The carbon nanotube composite layer 10 parallel with the surface of the semiconductor layer. The carbon nanotube composite layer 10 is electrically connected to the source electrode 102 and the drain electrode 103. Thus a conductive path can be formed between the source electrode 102 and the drain electrode 103 via the carbon nanotube composite layer 10.

The carbon nanotube composite layer 10 can be P-type or N-type, thus the thin film transistor can be P-type or N-type. Furthermore, while the carbon nanotube composite layer 10 is N-type, an $HfO_2$ layer can cover the carbon nanotube composite layer 10 to avoid that the carbon nanotubes be exposed in the air.

Figure 6:
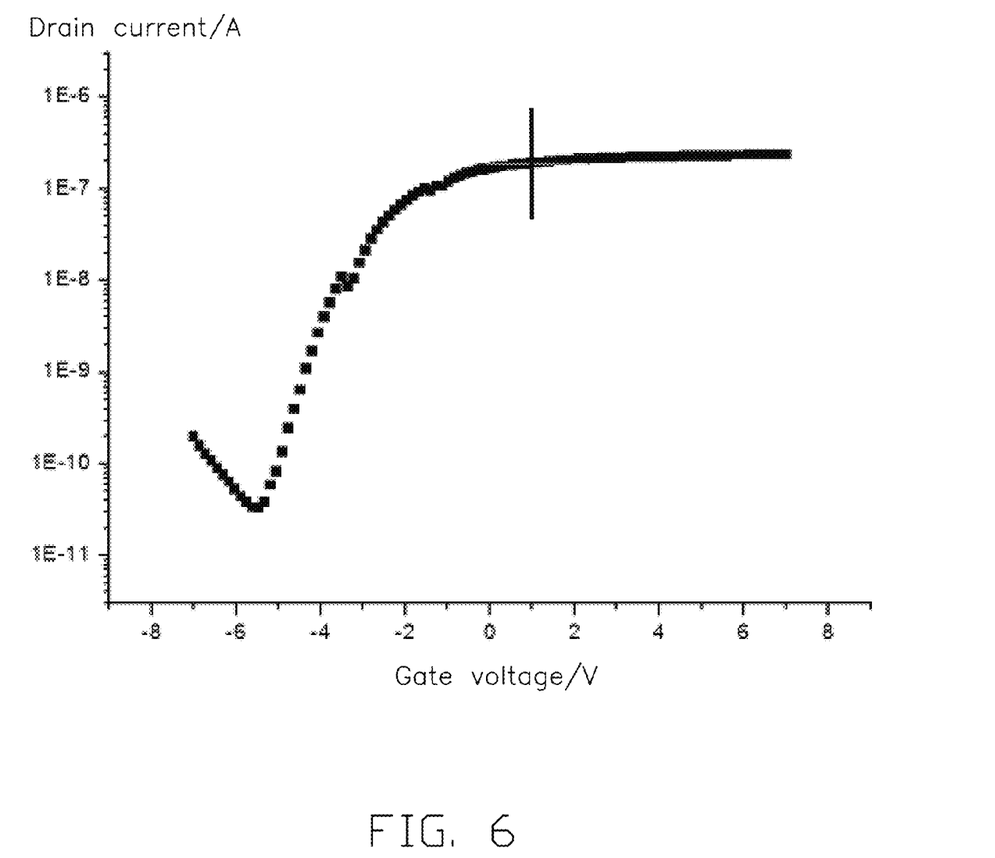
FIG. 6 shows a test graph of transfer characteristics of a semiconductor layer, in which the carbon nanotube composite film comprises at least 95% semiconductor carbon nanotubes.
Figure 7:
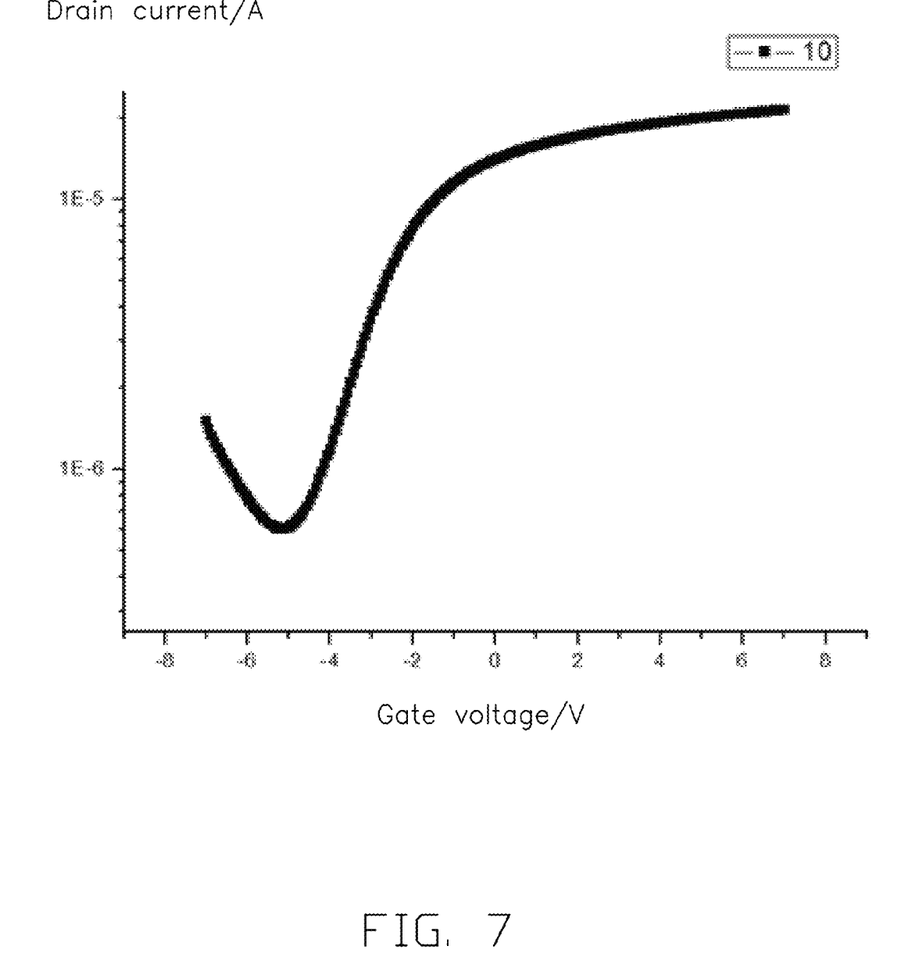
FIG. 7 shows a test graph of transfer characteristics of a semiconductor layer, in which the carbon nanotube composite film comprises ⅔ semiconductor carbon nanotubes.

Referring to FIG. 6, while the ratio of the semiconductor carbon nanotubes in the carbon nanotube composite layer 10 is about 95%, the current switch ratio of the carbon nanotube composite layer is greater than $10^4$, thus the carbon nanotube composite layer is suitable for logic device. Referring to FIG. 7, while the ratio of the semiconductor carbon nanotubes in the carbon nanotube composite layer 10 is about 2/3, the saturation current of the carbon nanotube composite layer 10 is greater than 10A. Thus the carbon nanotube composite layer 10 has strong conductor ampacity, and the carbon nanotube composite layer 10 is suitable for power devices.

Furthermore, the semiconductor type of the carbon nanotube semiconductor layer 10 can be adjusted via adjusting the ratio between the carbon nanotubes and the semiconductor particles. In one embodiment, the semiconductor particles adapt $MoS_2$, while the weight ratio of the carbon nanotubes is relatively higher, the carbon nanotube composite layer 10 is suitable for power devices; while the weight ratio of the $MoS_2$ is relatively higher, the carbon nanotube composite layer 10 has better switch ratio, and the carbon nanotube composite layer 10 is suitable for logic devices.

In one embodiment, the weight ratio between the carbon nanotubes and semiconductor particles is about 1:1000. The material of the semiconductor particle is $MoS_2$; the shape of the semiconductor particles is quadrilateral, the semiconductor particles is about 0.1 square micrometers to about 3 square micrometers; each of the semiconductor particles has about 10 layers of molecular layers; the thickness of the semiconductor particles is about 7 nanometers; the diameter of the carbon nanotube is about 3 nm, the thickness of the carbon nanotubes composite layer is about 15 nanometers.

The material of the insulating layer 104 can be a rigid material such as aluminum oxide ($Al_2O_3$), silicon nitride ($Si_3N_4$), silicon dioxide ($SiO_2$), or a flexible material such as polyethylene terephthalate (PET), benzocyclobutenes (BCB), polyester or acrylic resins. A thickness of the insulating layer 104 can be in a range from about 10 nanometers to about 100 micrometers. In one embodiment, the material of the insulating layer 104 is $Al_2O_3$.

The material of the gate electrode 105 can be selected from the group consisting of metal, metal alloy, indium tin oxide (ITO), antimony tin oxide (ATO), silver paste, conductive polymer, or metallic carbon nanotubes. The metal or metal alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metals. In one embodiment, the material of the gate electrode 105 is Mo, and the thickness of the gate electrode 105 is about 40 nanometers.

The insulating substrate 110 supports the thin film transistor 100. The material of the insulating substrate 110 can be the same as a substrate of a printed circuit board (PCB), and can be rigid materials (e.g., p-type or n-type silicon, silicon with an silicon dioxide layer formed thereon, crystal, crystal with a oxide layer formed thereon), or flexible materials (e.g., plastic or resin). In one embodiment, the material of the insulating substrate is glass. The shape and size of the insulating substrate 110 is arbitrary. The plurality of thin film transistors 100 can be located on the insulating substrate 110 in a predetermined order.

In use, the source electrode 151 is grounded. A voltage Vds is applied to the drain electrode 103. Another voltage Vg is applied on the gate electrode 105. The voltage Vg forms an electric field in the channel 106 of the semiconducting layer 101. Accordingly, carriers will exist in the channel near the gate electrode 105. As the Vg increases, a current is generated and flows through the channel 106. Thus, the source electrode 102 and the drain electrode 103 are electrically connected. Furthermore, because the semiconductor fragments 1010 in the semiconductor layer 101 have few semiconductor molecular layers, the semiconductor layer 101 can be easily modulated by the gate electrode 105, and the thin film transistor 100 can have better on/off ratio.

Figure 8:
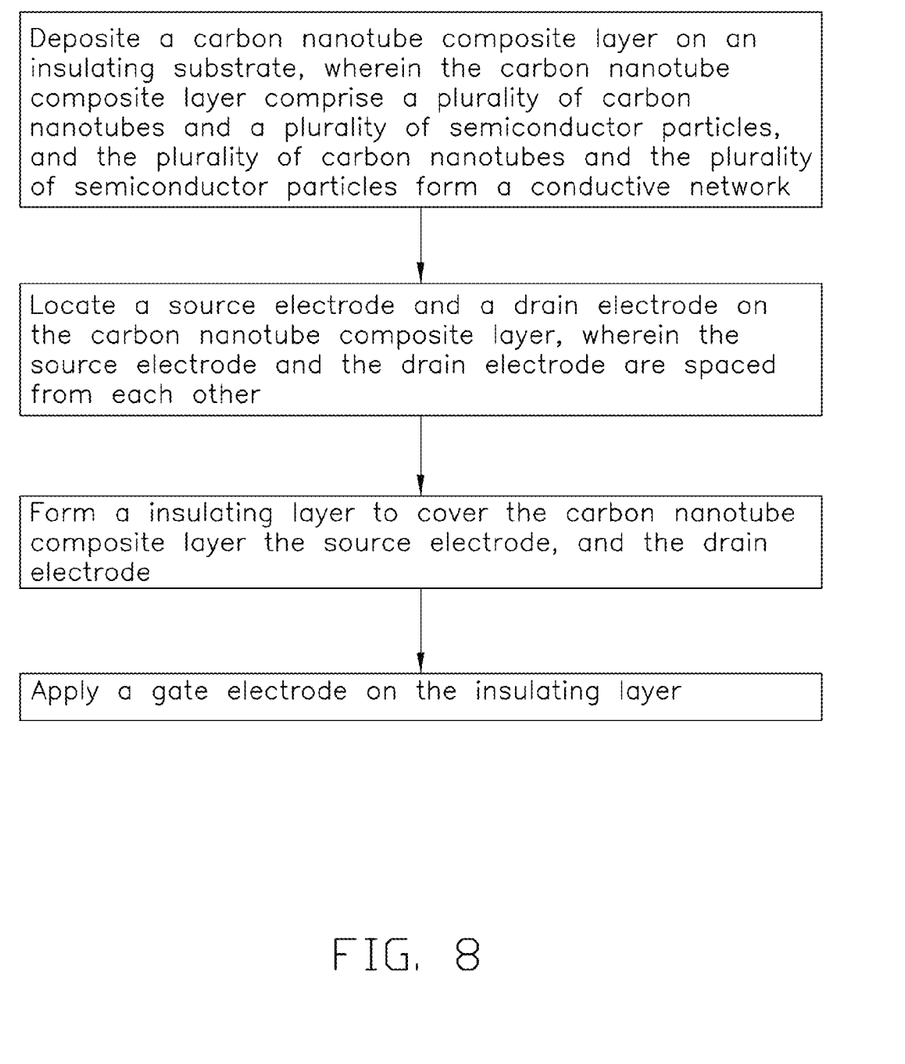
FIG. 8 shows a schematic view of one embodiment of a method of making TFT.

Referring to FIG. 8, one embodiment of a method of making thin film transistor 100 comprises:

step (S21), depositing a carbon nanotube composite layer on an insulating substrate 110, wherein the carbon nanotube composite layer comprise a plurality of carbon nanotubes and a plurality of semiconductor particles, and the plurality of carbon nanotubes and the plurality of semiconductor particles form a conductive network;

step (S22), locating a source electrode 102 and a drain electrode 103 on the carbon nanotube composite layer, wherein the source electrode 102 and the drain electrode 103 are spaced from each other;

step (S23), forming a insulating layer 104 to cover the carbon nanotube composite layer the source electrode, and the drain electrode 103; and step (S24), applying a gate electrode 105 on the insulating layer 104.

In step (S21), the carbon nanotube composite layer can be applied on the insulating substrate 110 via:

step (S211), providing a first suspension comprising the plurality of carbon nanotubes;

step (S212), forming s second suspension comprising the plurality of semiconductor particles;

step (S213), depositing the plurality of semiconductor particles on the insulating substrate 110, and step (S214), depositing the plurality of carbon nanotubes on the insulating substrate 110 with the plurality of semiconductor particles.

In one embodiment, the first suspension is obtained by sonicating the semiconductor particles in the NMP. The deposition time of the semiconductor particles is about 8 hours. The second suspension is obtained by mixing and sonicating the carbon nanotubes in the NMP. The deposition time of the carbon nanotubes is about 30 minutes. The weight ratio between the carbon nanotubes and the semiconductor particles is about 1:1000.

In step (S22), the source electrode 102 and the drain electrode 103 can be formed via screen printing method, magnetron sputtering method, vapor deposition, or atomic layer deposition method. The source electrode 102 and the drain electrode 103 can be formed through a pattern mask layer or etching method. In one embodiment, the source electrode 102 and the drain electrode 103 are formed by etching a conductive film. In another embodiment, the source electrode 102 and the drain electrode 103 can also be formed by vapor deposition.

In step (S23), the insulating layer 104 can be formed by magnetron sputtering method, vapor deposition method, or an atomic layer deposition method. In one embodiment, the insulating layer 104 is formed by depositing alumina layer by atomic layer deposition method, and the thickness of the insulating layer 104 is about 100 nanometers.

In step (S24), the gate electrode 105 can be formed via screen printing method, magnetron sputtering method, vapor deposition, or atomic layer deposition method. The gate electrode 105 can be a continuous layered structure. Furthermore, the insulating substrate 110 can comprise the plurality of gate electrodes 105 spaced from each other. The plurality of gate electrodes 105 can be formed through a pattern mask layer or etching method. In one embodiment, the plurality of gate electrodes 105 are formed by etching a conductive film. In another embodiment, the plurality of gate electrodes 105 can also be formed by vapor deposition.

Depending on the embodiments, certain of the steps described may be removed, others may be added, and the sequence of steps may be altered. It is also to be understood that the description and the claims drawn to a method may comprise some indication in reference to certain steps. However, any indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in the matters of shape, size, and arrangement of parts within the principles of the disclosure.

What is claimed is:

1. A carbon nanotube composite layer comprising:
a plurality of carbon nanotubes and a plurality of semiconductor particles;
wherein the plurality of semiconductor particles are dispersed into the plurality of carbon nanotubes, the plurality of carbon nanotubes are electrically connected with the plurality of semiconductor particles, each of the plurality of semiconductor particles comprises a plurality of semiconductor molecular layers stacked together, a number of the semiconductor molecular layers ranges from about 1 to about 20, an area of each of the plurality of semiconductor particles ranges from about 0.1 square micrometers to about 5 square micrometers, and a thickness of each of the plurality of semiconductor particles ranges from about 2 nanometers to about 20 nanometers.

2. The carbon nanotube composite layer of claim 1, wherein the plurality of semiconductor particles are in directly contact with the plurality of carbon nanotubes.

3. The carbon nanotube composite layer of claim 2, wherein the plurality of semiconductor particles and the plurality of carbon nanotubes are electrically connected with each other to form a conductive network.

4. The carbon nanotube composite layer of claim 1, wherein a distribution density of the plurality of carbon nanotubes ranges from about 5 per square micrometers to about 15 per square micrometers.

5. The carbon nanotube composite layer of claim 1, wherein the plurality of carbon nanotubes are single walled carbon nanotubes.

6. The carbon nanotube composite layer of claim 5, wherein the single walled carbon nanotubes are pure semiconductor carbon nanotubes.

7. The carbon nanotube composite layer of claim 6, wherein the plurality of carbon nanotubes are entangled together via van der Waals force.

8. The carbon nanotube composite layer of claim 1, wherein each of the plurality of semiconductor particles is an N-type semiconductor particle or a P-type semiconductor particle.

9. The carbon nanotube composite layer of claim 8, wherein a material of the P-type semiconductor particle is selected from the group consisting of $WS_2$, $WSe_2$, and $WTe_2$.

10. The carbon nanotube composite layer of claim 8, wherein a material of the N-type semiconductor particle is selected from the group consisting of $MoS_2$, $BN$, $MnO_2$, $ZnO$, and $MoTe_2$.

11. The carbon nanotube composite layer of claim 1, wherein a distribution density of the plurality of semiconductor particles ranges from about 5 per square micrometers to about 10 per square micrometers.

12. The carbon nanotube composite layer of claim 1, wherein an area ratio of the plurality of semiconductor particles ranges from about 30% to about 50%, and the area ratio is defined as a ratio of a surface of the carbon nanotube composite layer covered by the plurality of semiconductor particles.

13. The carbon nanotube composite layer of claim 1, wherein the area of each of the plurality of semiconductor particles ranges from about 0.1 square micrometers to about 3 square micrometers.

14. The thin film transistor of claim 1, wherein the thickness of each of the plurality of semiconductor particles ranges from about 2 nanometers to about 10 nanometers.

15. A carbon nanotube composite layer, the carbon nanotube composite layer comprising:
a plurality of carbon nanotubes and a plurality of semiconductor particles, wherein the plurality of carbon nanotubes and the plurality of semiconductor particles form a conductive network, a number of the semiconductor molecular layers ranges from about 1 to about 20, and a distribution density of the plurality of semiconductor particles ranges from about 5 per square micrometers to about 10 per square micrometers.

16. The carbon nanotube composite layer of claim 15, wherein a weight ratio between the plurality of carbon nanotubes and the plurality of semiconductor particles ranges form about 1:1000 to about 1:3000.

17. The carbon nanotube composite layer of claim 15, wherein each of the plurality of semiconductor particles comprises a plurality of semiconductor molecular layers.

18. The carbon nanotube composite layer of claim 1, wherein the plurality of carbon nanotubes comprises a plurality of semiconductor carbon nanotubes, and a percentage of the semiconductor carbon nanotubes in the plurality of carbon nanotubes is greater than 66.7%.

19. The carbon nanotube composite layer of claim 1, further comprising a $HfO_2$ layer covering the plurality of carbon nanotubes and the plurality of the semiconductor particles.

* * * * *